(12) United States Patent
Ho et al.

(10) Patent No.: US 6,225,221 B1
(45) Date of Patent: May 1, 2001

(54) METHOD TO DEPOSIT A COPPER SEED LAYER FOR DUAL DAMASCENE INTERCONNECTS

(75) Inventors: Paul Kwok Keung Ho; Mei Sheng Zhou; Subhash Gupta; Chockalingam Ramasamy, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/501,966

(22) Filed: Feb. 10, 2000

(51) Int. Cl.[7] ............................................. H01L 21/44

(52) U.S. Cl. ......................... 438/678; 438/637; 438/671

(58) Field of Search .................................. 438/637–640, 438/671–675, 687, 689; 257/457, 762

(56) References Cited

U.S. PATENT DOCUMENTS

| | | | |
|---|---|---|---|
| 5,350,484 | 9/1994 | Gardner et al. | 156/628 |
| 5,424,252 | 6/1995 | Morishita . | |
| 5,654,245 | * 8/1997 | Allen | 438/629 |
| 5,668,054 | 9/1997 | Sun et al. | 438/653 |

OTHER PUBLICATIONS

R.A. Kent et al., "Mass Spectrometric Studies at High Temperatures. IX. The Sublimation Pressure of Copper(II) Fluoride", Journal of Physical Chemistry, vol. 70, No. 3, Mar. 1966, pp. 874–877.

M.E. Gross et al., "Implications of dual damascene for electroplated copper intercon ts", Solid State Technology, Aug. 1999, pp. 47–52.

* cited by examiner

*Primary Examiner*—David Nelms
*Assistant Examiner*—Dung A Le
(74) *Attorney, Agent, or Firm*—George O. Saile; Rosemary L. S. Pike

(57) ABSTRACT

A new method of depositing a copper seed layer in the manufacture of an integrated circuit device has been achieved. The copper seed layer is thin and conformal and well-suited for subsequent electroless plating of copper. A dielectric layer, which may comprise a stack of dielectric material, is provided overlying a semiconductor substrate. The dielectric layer patterned to form vias and trenches for planned dual damascene interconnects. A barrier layer comprising tantalum, titanium, or tungsten is deposited overlying the dielectric layer to line the vias and trenches. A copper seed layer is deposited overlying the barrier layer by the reaction of $CuF_2$ vapor with the barrier layer, and the integrated circuit is completed.

20 Claims, 3 Drawing Sheets

METHOD TO DEPOSIT A COPPER SEED LAYER FOR DUAL DAMASCENE INTERCONNECTS

Related Patent Application U.S. patent application Ser. No. 09/501,968 (CS-99-159) to S. Gupta et al.

BACKGROUND OF THE INVENTION (1) Field of the Invention

The invention relates to a method of fabricating semiconductor structures, and more particularly, to a method of depositing a copper layer for dual damascene interconnects in the manufacture of integrated circuit devices.

(2) Description of the Prior Art

Damascene technology is an important capability in the present art of semiconductor manufacturing. The use of damascene and dual damascene schemes facilitates the use of copper for interconnects. Copper offers significant advantages due to its low resistivity when compared to aluminum.

Several approaches are currently available for depositing copper in integrated circuit manufacturing. First, the copper may be deposited by physical vapor deposition (PVD). PVD, or ionized PVD, processes benefit from available technology and relatively high throughput. However, PVD deposited copper has poor step coverage (less than 5%). Second, chemical vapor deposition (CVD) offers better step coverage than PVD. However, the deposited copper is not uniform in thickness. In addition, CVD requires the use of expensive materials called precursors to catalyze the reaction. Liquid precursors have difficult vaporization properties. Third, electroplating and electroless plating of copper are attractive alternatives to PVD and CVD because of lower equipment and material costs. However, plating methods require the presence of a seed layer to conduct or to catalyze the deposition reaction. This seed layer typically comprises copper, though other materials such as refractory metals have been suggested. When this seed layer is copper, it is typically deposited by a PVD process. In addition, electroless plating requires an induction layer as a catalytic surface and the use of reducing agents. Finally, plating processes can be very slow and dirty.

Referring now to FIG. 1, a cross-section of a partially completed prior art integrated circuit device is shown. A dual damascene trench has been formed using a conventional method. A semiconductor substrate 8 is shown. A dielectric layer 10, which may be a composite structure made up of several layers of dielectric material, is formed overlying the semiconductor substrate 8. Following the via and trench etch, a barrier layer 14 is formed overlying the opening. The barrier layer is comprised of a material that can prevent copper ion out-diffusion from the copper interconnect into the dielectric layer 10.

A copper plating process is intended for this prior art example. Therefore, a copper seed layer 18 is deposited overlying the barrier layer 14 by a physical vapor deposition process (PVD). Due to the limitations of PVD, however, the copper seed layer 18 does not cover the steps of the dual damascene trench adequately as shown by 22. The purpose of the present invention is to achieve a copper seed layer deposition process that is clean and conformal, meaning it has excellent step coverage, and does not require expensive precursors.

Several prior art approaches disclose methods to deposit metal layers in an integrated circuit device and related topics. In R. A. Kent et al, "Mass Spectrometric Studies at High Temperatures. IX. The Sublimation Pressure of Copper (II) Fluoride," *The Journal of Physical Chemistry*, Volume 70, number 3, March 1966, pp. 874–877, the authors attempt to measure the activation energy and the bond energy of $CuF_2$. This bond is found to be very weak. The paper reports that sublimated $CuF_2$ vapor reacts with tantalum at high temperature to produce solid copper and $TaF_5$ gas. M. E. Gross et al., "Implications of dual damascene for electroplated copper interconnects," *Solid State Technology*, August 1999, pp. 47–52, focuses on the influence of damascene topology on the process of recrystallization of plated copper. This reference mentions the plating of copper onto a PVD copper seed layer overlying a PVD tantalum layer. U.S. Pat. No. 5,654,245 to Allen teaches a method to selectively metallize a semiconductor device. After forming apertures of a metal phobic layer into the support layer, a nucleating species is implanted. The nucleating species disclosed comprise molybdenum, tungsten, tantalum, and titanium. Copper is then selectively deposited by either metal-organic chemical vapor deposition (CVD), plasma-enhanced metal-organic CVD, or electroplating. U.S. Pat. No. 5,668,054 to Sun et al discloses a method to form a tantalum nitride diffusion barrier for use in a copper metalization scheme. The tantalum nitride is formed using a metal-organic CVD process. The copper layer is then formed overlying the tantalum nitride layer by either CVD or PVD. U.S. Pat. No. 5,350,484 to Gardner et al teaches a method to etch metals, including copper. Ions are implanted into the metal to improve etchability. For example, fluorine atoms may be implanted into copper. The resulting $Cu_xF_y$ (copper Fluoride) can be etched using HCl, HF, $H_2O$, or mineral acid. U.S. Pat. No. 5,424,252 to Morishita discloses an electroless metal plating process that can be used to plate copper in a semiconductor device. Co-pending U.S. patent application Ser. No. 09/501968 (CS-99-159) to S. Gupta et al filed Feb. 10, 2000 teaches a method of depositing copper by disproportionation of simple Cu(I) ion to form an aqueous solution.

SUMMARY OF THE INVENTION

A principal object of the present invention is to provide an effective and very manufacturable method of depositing a copper layer in the manufacture of integrated circuits.

A further object of the present invention is to provide a method to deposit a copper seed layer for use in subsequent electroless copper plating.

A still further object of the present invention is to provide a method to deposit a copper seed layer that does not require expensive precursors.

Another still further object of the present invention is to provide a method to deposit a copper seed layer that is thin and conformal.

Yet another further object of the present invention is to provide a method to deposit a copper seed layer for electroless copper plating in the fabrication of dual damascene interconnects in the manufacture of an integrated circuit device.

In accordance with the objects of this invention, a new method of depositing a copper seed layer in the manufacture of an integrated circuit device has been achieved. A dielectric layer, which may comprise a stack of dielectric material, is provided overlying a semiconductor substrate. The dielectric layer is patterned to form vias and trenches for planned dual damascene interconnects. A barrier layer comprising tantalum, titanium, or tungsten is deposited overlying the dielectric layer to line the vias and trenches. A copper seed layer is deposited overlying the barrier layer by the reaction of CuF$_2$(copper(II)Fluoride) vapor with the barrier layer, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of dual damascene interconnects in the manufacture of an integrated circuit device. It should be clear to those experienced in the art that the present invention can be applied and extended without deviating from the scope of the present invention.

Figure 1:
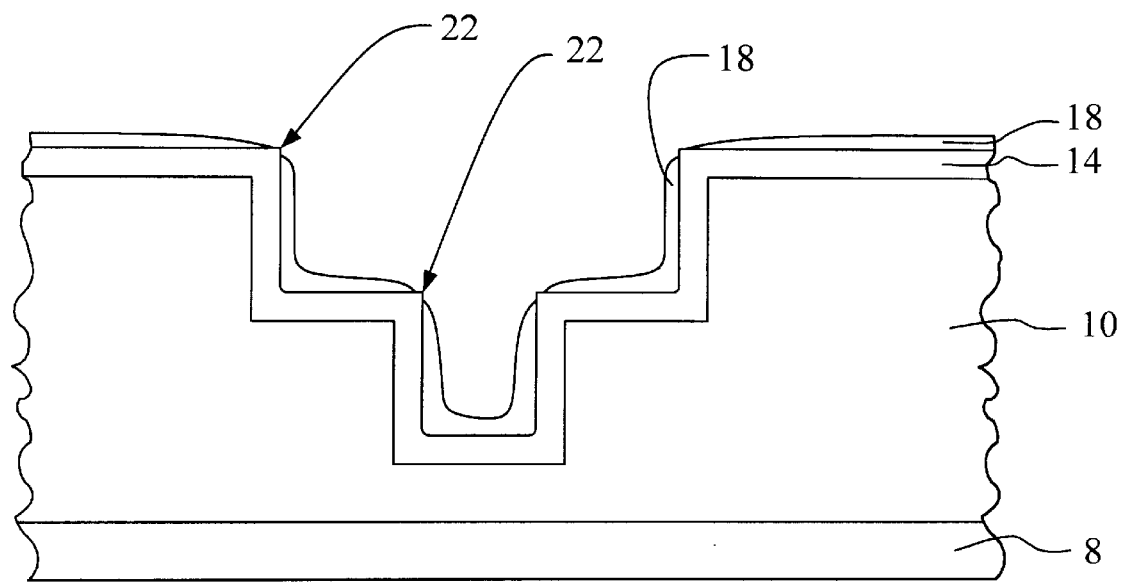
FIG. 1 schematically illustrates in cross-section a partially completed prior art integrated circuit device.
Figure 2:
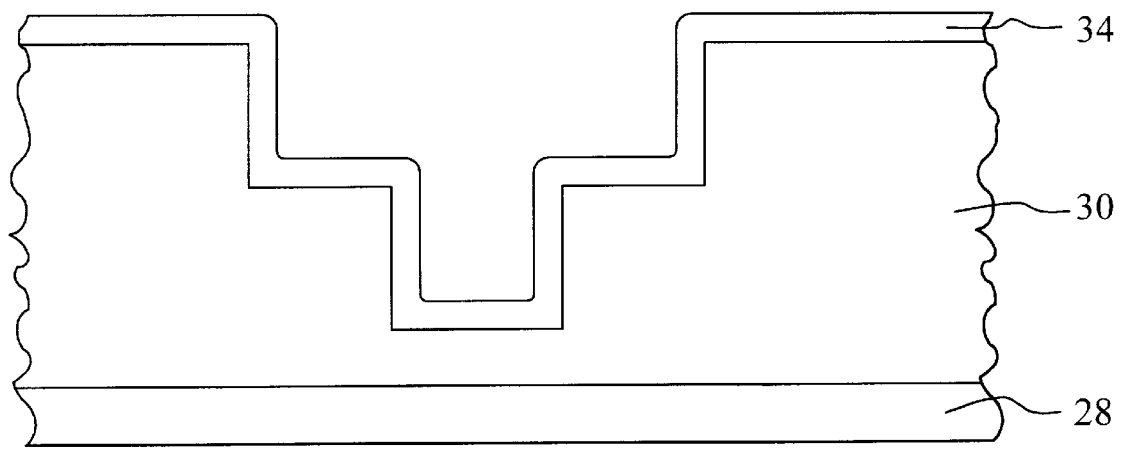
FIGS. 2 through 4 schematically illustrate in cross-sectional representation the preferred embodiment of the present invention.

Referring now particularly to FIG. 2, there is shown a cross section of a partially completed integrated circuit device of the preferred embodiment. A semiconductor substrate 28, typically consisting of monocrystalline silicon, is provided. A dielectric layer 30 is deposited overlying the semiconductor substrate 28. The dielectric layer 30 is shown as a single layer for purposes of simplification. In practice, the dielectric layer 30 comprises a stack or composite of dielectric material. Typically, silicon dioxide based materials would be used for the interlevel dielectric material. Silicon nitride would also be used as an etching stop layer or as a polishing stop layer in the composite stack. In addition, lower levels of metalization are formed below and connecting to the via of the dual damascene structure. These layers have also been omitted for simplification. The dielectric layer 30 is etched to form vias and trenches for planned dual damascene interconnects. The vias are connected to the lower level metalization. The typical dual damascene profile is seen in FIG. 2.

An important part of the present invention is now disclosed. A barrier layer 34 is deposited overlying the dielectric layer 30 and lining the vias and trenches. The barrier layer 34 is typically comprised of a material that will eliminate out-diffusion of copper ions from the dual damascene interconnect into the dielectric layer 30. In the present invention, the barrier layer 34 also serves as a catalyst for the copper deposition reaction. The barrier layer 34 preferably comprises one of the group containing:

tantalum, titanium, and tungsten. The barrier layer is deposited using a physical vapor deposition (PVD) process to a thickness of between about 50 Angstroms and 1000 Angstroms.

Alternatively, the barrier layer 34 may comprise a stack of materials. For example, tantalum nitride may first be deposited overlying the dielectric layer 30. Then, a pure tantalum layer would be deposited overlying the tantalum nitride material. This composite stack of barrier materials provides a different barrier and polishing characteristic that may be advantageous for the process integration. Similarly, a titanium compound may be deposited prior to pure titanium or a tungsten compound prior to pure tungsten. In the present invention, if this option were used, the barrier layer would comprise one of the group containing: tantalum overlying tantalum compound, titanium overlying titanium compound, and tungsten overlying tungsten compound.

Figure 3:
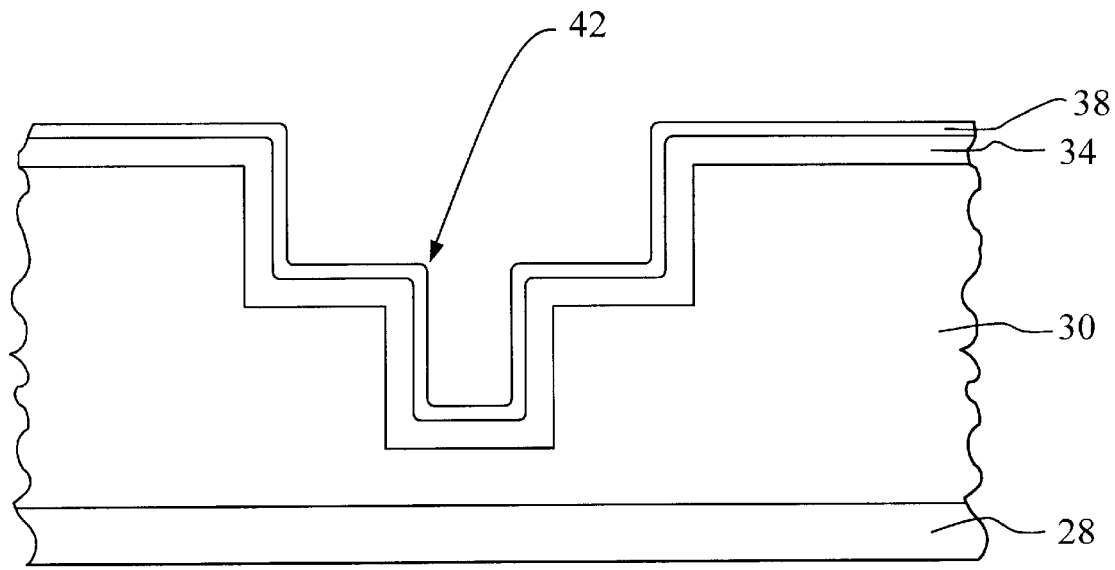

Referring now to FIG. 3, an important feature of the present invention is described. A copper seed layer 38 is deposited overlying the barrier layer 34. The copper seed layer 38 is deposited by the reaction of CuF$_2$ vapor with the barrier layer 34. The reaction employed to deposit copper depends upon the specific barrier material. For example, if the barrier layer 34 is tantalum, the reaction is:

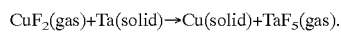

$$CuF_2(gas)+Ta(solid)\rightarrow Cu(solid)+TaF_5(gas).$$

For titanium, the reaction is:

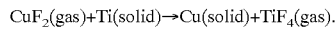

$$CuF_2(gas)+Ti(solid)\rightarrow Cu(solid)+TiF_4(gas).$$

For tungsten, the reaction is:

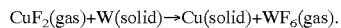

$$CuF_2(gas)+W(solid)\rightarrow Cu(solid)+WF_6(gas).$$

The copper seed layer 38 deposited by the reaction of the present invention can be made very thin while still exhibiting excellent step coverage or conformity. The copper seed layer 38 is conformal because the process is a stoichiometric exchange of copper atoms for barrier layer 34 atoms. It is also a very clean process. The copper seed layer 38 is deposited to a few layers of copper atoms.

Figure 5:
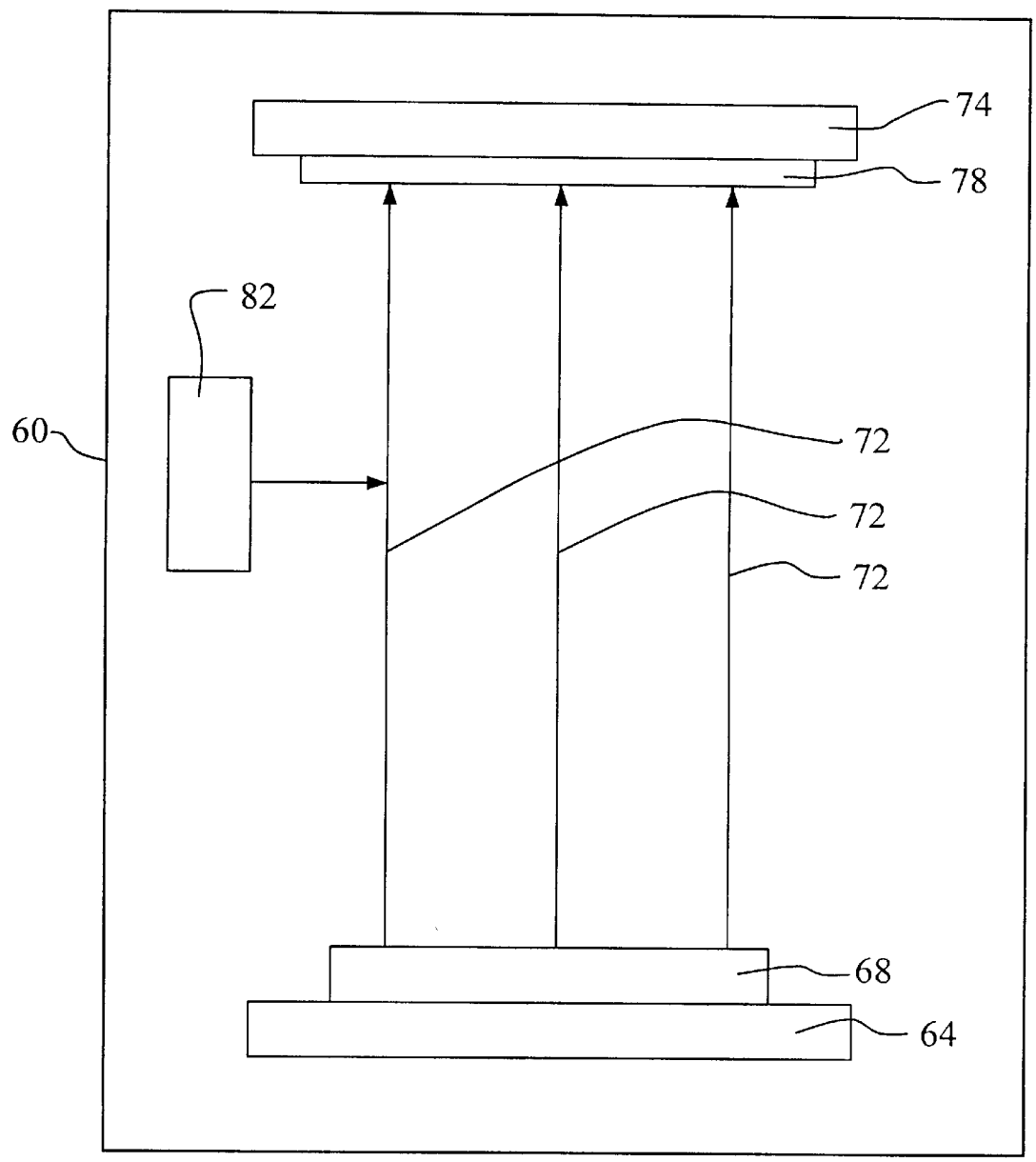
FIG. 5 schematically illustrates the reaction chamber and process of the present invention.

Referring now to FIG. 5, a schematic representation of the deposition process is shown to illustrate the key concepts and parameters. The integrated circuit wafer 78 is placed on a wafer chuck 74. The wafer 78 has the barrier layer 34 on the top surface as in FIG. 2. A solid source of CuF$_2$ 68 is placed on a heated chuck. The solid source of CuF$_2$ 68 is heated to a temperature of between about 400 degrees C. and 800 degrees C. to cause sublimation of the CuF$_2$ into a vapor 72. The CuF$_2$ vapor 72 contacts the integrated circuit wafer 78. The CuF$_2$ vapor 72 reacts with the barrier metal to form the copper seed layer 38 overlying the barrier layer 34. The barrier metal fluorine gas is given off as a by-product of the reaction as shown in the equations.

As an option, the reaction may be plasma assisted 82. Plasma assisting can further improve the step coverage and adhesion of the deposited copper seed layer 38. If used, the plasma assist would comprise radio frequency energy of, for example, between about 13.56 MHz at a power of between about 100 Watts and 3000 Watts. Plasma assisting increases the active species, such as CuF*, concentration. In addition, the plasma assist improves the directionality and thus the step coverage and uniformity of deposition.

Another option is temperature control of the wafer chuck 74. By altering the temperature of the wafer 78, the speed of the reaction can be controlled. If this option is used, the temperature of the wafer is preferably controlled to between about 300 degrees C. and 600 degrees C. By using temperature control, the reaction rate can be controlled. In addition, temperature control enables optimization of the condensation and evaporation rate.

Wafer bias is another option in the process of depositing the copper seed layer 38 in the present invention. A wafer bias power may be employed to improve the copper seed layer 38. The use of wafer bias increases directionality and thus improves step coverage and uniformity. If used, a wafer bias power of preferably between about 50 watts and 2000 watts is used.

Figure 4:
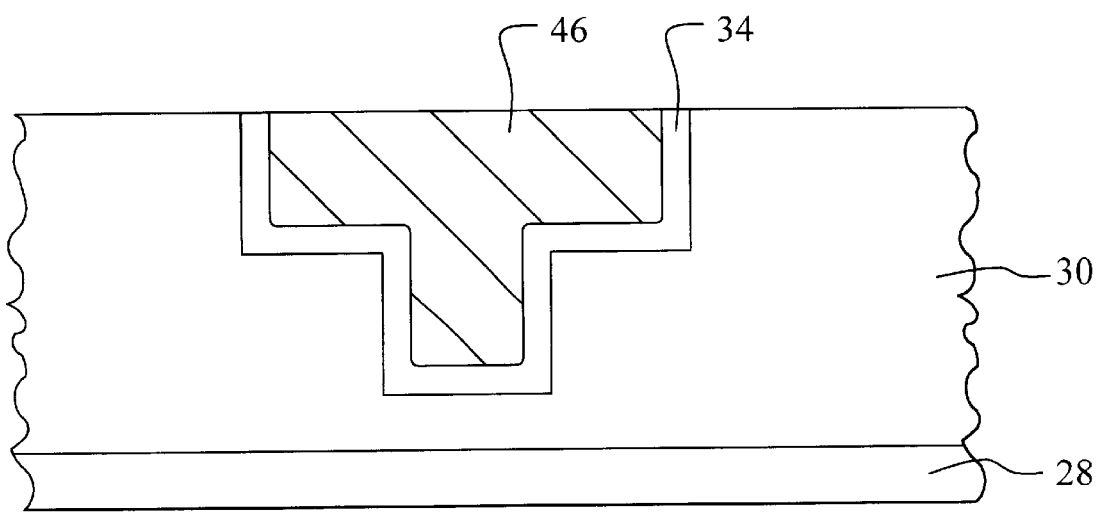

Referring now to FIG. 4, the copper seed layer 38 is used to catalyze an electroless copper plating to deposit the copper layer 46 overlying the barrier layer 34. The clean, thin, and conformal copper seed layer 38 facilitates excellent electroless copper deposition. A chemical mechanical polish is performed to remove excess copper layer 46. The dual damascene interconnects are completed, and the integrated circuit device is completed.

Now the specific advantages of the present invention compared to the prior art can be listed. First, the novel process deposits the copper seed layer more conformally than PVD. Second, the seed layer can be kept very thin while still covering the steps. Third, the process does not require expensive precursors as most CVD processes do. Fourth, the process is faster and cleaner than electroless plating and does not require induction layers to plate.

As shown in the preferred embodiments, the present invention provides a very manufacturable process for depositing a copper seed layer in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to deposit a copper seed layer for electroless copper plating in the fabrication of dual damascene interconnects in the manufacture of an integrated circuit device comprising:

providing a dielectric layer overlying a semiconductor substrate;

patterning said dielectric layer to form trenches for planned dual damascene interconnects;

depositing a barrier layer overlying said dielectric layer;

depositing a copper seed layer overlying said barrier layer wherein said depositing is by reacting $CuF_2$(copper(II) Fluoride) gas with said barrier layer; and performing said electroless copper plating using said copper seed layer to complete said integrated circuit device.

2. The method according to claim 1 wherein said barrier layer comprises one of the group containing: tantalum, titanium, and tungsten.

3. The method according to claim 1 wherein said barrier layer is deposited to a thickness of between about 50 Angstroms and 1000 Angstroms.

4. The method according to claim 1 wherein said step of depositing said copper seed layer is performed with a plasma assist comprising: radio frequency energy of about 13.56 MHz at a power of between about 100 Watts and 3000 Watts.

5. The method according to claim 1 wherein said step of depositing said copper seed layer is performed with a controlled wafer temperature of between about 300 degrees C. and 600 degrees C.

6. The method according to claim 1 wherein said step of depositing said copper seed layer is performed with a wafer bias power of between about 50 watts and 2000 watts.

7. The method according to claim 1 wherein said copper seed layer is deposited to a thickness of about a few atomic layers of copper.

8. The method according to claim 1 further comprising:

depositing a barrier compound layer overlying said semiconductor substrate prior to said step of depositing said barrier layer wherein said barrier compound layer comprises on of the group containing: tantalum-containing compounds, titanium-containing compounds, and tungsten-containing compounds.

9. A method to deposit a copper seed layer for electroless copper plating in the fabrication of dual damascene interconnects in the manufacture of an integrated circuit device comprising:

providing a dielectric layer overlying a semiconductor substrate;

patterning said dielectric layer to form trenches for planned dual damascene interconnects;

depositing a barrier layer overlying said dielectric layer wherein said barrier layer comprises one of the group containing: tantalum, titanium, and tungsten;

depositing a copper seed layer overlying said barrier layer wherein said depositing is by reacting $CuF_2$(copper(II) Fluoride) gas with the barrier layer; and performing said electroless copper plating using said copper seed layer to complete said integrated circuit device.

10. The method according to claim 9 wherein said barrier layer is deposited to a thickness of between about 50 Angstroms and 1000 Angstroms.

11. The method according to claim 9 wherein said step of depositing said copper seed layer is performed with a plasma assist comprising: radio frequency energy of about 13.56 MHz at a power of between about 100 Watts and 3000 Watts.

12. The method according to claim 9 wherein said step of depositing said copper seed layer is performed with a controlled wafer temperature of between about 300 degrees C. and 600 degrees C.

13. The method according to claim 9 wherein said step of depositing said copper seed layer is performed with a wafer bias power of between about 50 watts and 2000 watts.

14. The method according to claim 9 wherein said copper seed layer is deposited to a thickness of about a few atomic layers of copper.

15. The method according to claim 9 further comprising:

depositing a barrier compound layer overlying said semiconductor substrate prior to said step of depositing said barrier layer wherein said barrier compound layer comprises on of the group containing: tantalum-containing compounds, titanium-containing compounds, and tungsten-containing compounds.

16. A method to deposit a copper seed layer for electroless copper plating in the fabrication of dual damascene interconnects in the manufacture of an integrated circuit device comprising:

providing a dielectric layer overlying a semiconductor substrate;

patterning said dielectric layer to form trenches for planned dual damascene interconnects;

depositing a barrier layer overlying said dielectric layer wherein said barrier layer comprises one of the group containing: tantalum, titanium, and tungsten;

depositing a copper seed layer overlying said barrier layer wherein said depositing is by reacting $CuF_2$(copper(II) Fluoride) gas with the barrier layer wherein said depositing is with a plasma assist comprising: radio frequency energy of about 13.56 MHz at a power of between about 100 Watts and 3000 Watts; and performing said electroless copper plating using said copper seed layer to complete said integrated circuit device.

17. The method according to claim 16 wherein said step of depositing said copper seed layer is performed with a controlled wafer temperature of between about 300 degrees C. and 600 degrees C.

18. The method according to claim 16 wherein said step of depositing said copper seed layer is performed with a wafer bias power of about 50 watts and 2000 watts.

19. The method according to claim 16 wherein said copper seed layer is deposited to a thickness of about a few atomic layers of copper.

20. The method according to claim 16 further comprising:

depositing a barrier compound layer overlying said semiconductor substrate prior to said step of depositing said barrier layer wherein said barrier compound layer comprises on of the group containing: tantalum-containing compounds, titanium-containing compounds, and tungsten-containing compounds.

* * * * *